(12) United States Patent
Heinisch et al.

(10) Patent No.: US 9,275,915 B2
(45) Date of Patent: Mar. 1, 2016

(54) CIRCUIT DEVICE HAVING A SEMICONDUCTOR COMPONENT

(75) Inventors: Holger Heinisch, Reutlingen (DE); Joachim Joos, Emmering (DE); Thomas Jacke, Tuebingen (DE); Christian Foerster, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 937 days.

(21) Appl. No.: 13/513,758

(22) PCT Filed: Oct. 22, 2010

(86) PCT No.: PCT/EP2010/065919
§ 371 (c)(1),
(2), (4) Date: Aug. 21, 2012

(87) PCT Pub. No.: WO2011/069737
PCT Pub. Date: Jun. 16, 2011

(65) Prior Publication Data
US 2012/0306528 A1 Dec. 6, 2012

(30) Foreign Application Priority Data
Dec. 8, 2009 (DE) .......................... 10 2009 047 670

(51) Int. Cl.
*G01R 31/02* (2006.01)
*G01R 31/26* (2014.01)
(Continued)

(52) U.S. Cl.
CPC ................ *H01L 22/22* (2013.01); *H01L 22/14* (2013.01); *H01L 23/5252* (2013.01); *G01R 31/2621* (2013.01); *G01R 31/2884* (2013.01); *H01L 2924/0002* (2013.01)

(58) Field of Classification Search
CPC .............. H01L 2924/1305; H01L 2224/48227
USPC ............. 324/762.08, 762.01, 762.05, 762.07, 324/762.09; 327/365, 442
See application file for complete search history.

(56) References Cited

U.S. PATENT DOCUMENTS

| | | | |
|---|---|---|---|
| 4,213,066 A * | 7/1980 | Rogers ................... | H05B 39/02 327/442 |
| 5,818,749 A | 10/1998 | Harshfield | |

(Continued)

FOREIGN PATENT DOCUMENTS

| | | |
|---|---|---|
| CN | 1835315 | 9/2006 |
| DE | 44 26 307 | 2/1996 |

(Continued)

OTHER PUBLICATIONS

International Search Report for PCT/EP2010/065919, dated May 27, 2011.

*Primary Examiner* — Huy Q Phan
*Assistant Examiner* — Giovanni Astacio-Oquendo
(74) *Attorney, Agent, or Firm* — Kenyon & Kenyon LLP (57) ABSTRACT

An electrical circuit device includes a semiconductor component which has power terminals and a control terminal electrically insulated from the power terminals, for applying a control voltage, and a control terminal contact surface for contacting the control terminal for measuring the electrical behavior of the semiconductor component. A connection device is provided, via which the control terminal is electrically connectable to a series device, the connection device being transferable from a nonconductive state into a conductive state, in which the control terminal is connected to the series device.

10 Claims, 6 Drawing Sheets

(51) Int. Cl.
*H01L 21/66* (2006.01)
*H01L 23/525* (2006.01)
*G01R 31/28* (2006.01)

(56) References Cited

U.S. PATENT DOCUMENTS

| | | | |
|---|---|---|---|
| 6,773,967 B1 | 8/2004 | Liu | |
| 7,268,596 B2* | 9/2007 | Ota | H03K 17/0822 327/112 |
| 7,342,301 B2* | 3/2008 | Frank et al. | 257/700 |
| 7,362,148 B2* | 4/2008 | Okitsu | H03K 17/687 324/750.3 |
| 2003/0030072 A1* | 2/2003 | Heinisch et al. | 257/200 |
| 2003/0062594 A1 | 4/2003 | Chen | |
| 2007/0290874 A1* | 12/2007 | Nearhoof et al. | 340/815.46 |
| 2009/0057417 A1* | 3/2009 | Shinohara | G11C 5/14 235/492 |
| 2010/0289524 A1* | 11/2010 | Or-Bach et al. | 326/38 |

FOREIGN PATENT DOCUMENTS

| | | |
|---|---|---|
| DE | 199 31 082 | 1/2001 |
| DE | 102 27 009 | 1/2004 |
| EP | 0 869 370 | 10/1998 |
| EP | 1 681 719 | 7/2006 |
| JP | 2-288366 | 11/1990 |

* cited by examiner

CIRCUIT DEVICE HAVING A SEMICONDUCTOR COMPONENT

BACKGROUND OF THE INVENTION

1. Field of the Invention

The present invention relates to a circuit device having a semiconductor component.

2. Description of the Related Art

Voltage-controlled power semiconductor switch components, e.g., metal-oxide-semiconductor field-effect transistor ("MOSFET) or isolated gate bi-polar transistor ("IBGT), are generally connected at their gate, which is used as the control input, to a series device, which may be an activation, driver, and/or protective circuit. Active clamping circuits are known as the protective circuit, by which a power transistor is actively notched up if a clamping voltage is exceeded and in this way the voltage is limited. If the circuit is designed as an integrated circuit (IC), the clamping circuit may be monolithically integrated into the component.

The gate is generally electrically separated from the conductive semiconductor areas of the power terminals via a gate oxide layer. For proper function, the gate must be sufficiently insulated; this property may be tested by measuring the gate leakage current before the circuit is put into operation. Furthermore, the semiconductor component may be subjected to a gate stress test, in which a high voltage is applied between the gate and a power terminal, e.g., between gate and source, and pre-aging of the gate oxide layer is performed to prevent early failures in the field (burn in).

Due to the fixed wiring of the semiconductor component with the series device, however, the problem results that the gate leakage current for testing the gate oxide quality may not be measured independently of the current flowing through the series device.

In order to nonetheless allow such a measurement, sometimes two bond pads which are not contacted with one another are provided, one of which is connected to the gate and the other of which is connected to the series device, so that initially a measurement may be carried out by contacting the gate measuring pad using a test needle and subsequently the two bond pads may be contacted with one another by a wire bond.

For this purpose, however, a manufacturing step of bonding is necessary, which causes additional costs and for which a corresponding installation space is necessary, which interferes in particular in the case of an integrated circuit. Furthermore, wire bonds are sensitive to mechanical influences, so that their automotive suitability is often limited with respect to the typical shocks.

Furthermore, it is known to irreversibly destroy structures. In the case of safety structures or "fuse" structures, for example, the structure is transferred by an electrical pulse or a laser cut, for example, from a low-resistance, i.e., generally sufficiently conductive state, into a high-resistance, i.e., essentially insulating state. Accordingly, structures are also known which may be transferred in the reverse direction, i.e., from a high-resistance initial state into a low-resistance state. U.S. Pat. No. 5,818,749 and U.S. Pat. No. 6,773,967 disclose such fusible link structures, which are also referred to as "antifuses" and may be irreversibly transferred by a power pulse from a high-resistance state into a low-resistance state. In this case, a pn-transition is destroyed in U.S. Pat. No. 5,818,749, and a dielectric, insulating layer is destroyed in U.S. Pat. No. 6,773,967.

BRIEF SUMMARY OF THE INVENTION

According to the present invention, between the control terminal, i.e., in particular a gate, and the series device, a connection device is provided, which is initially sufficiently insulating or high-resistance to allow a measurement of the semiconductor component and may subsequently be transferred into a conductive or low-resistant state, in which it therefore connects the control terminal to the series device. The measurement may in particular be a gate leakage current measurement and/or a gate stress measurement. The series device may be part of the circuit device according to the present invention or may be external.

In contrast to conventional systems having subsequently required bonding, according to the present invention, no subsequent attachment of conductive additional means is fundamentally necessary, but rather the already existing connection device may be transferred into its conductive state. Therefore, according to the present invention, the complete measurement may be performed initially, and subsequently, the final contact may be implemented directly between the control terminal or gate of the power semiconductor element and the series device by transferring the connection device into its conductive state.

According to the present invention, both an irreversible transfer and also a reversible transfer from the high-resistance state into the low-resistance state may be performed. To implement an irreversible transfer, an antifuse structure may be implemented in particular, which is transferred by a power pulse into its conductive state. The antifuse structure may be integrated according to the present invention into the layer design of the additional circuit; for this purpose, in particular an insulating layer may initially be implemented below the metal layer of the gate measuring pad and above a conductive layer, e.g., a semiconductor layer, the insulating layer subsequently being destroyed while forming a conductive connection, e.g., by molten metal entering into the destroyed area.

Therefore, by structuring a shared metal layer, two initially separate pads (contact surfaces) or pad areas may be implemented, one of which is electrically connected to the conductive semiconductor layer, e.g., a highly doped polysilicon layer, which is separated from the other pad by the insulating layer. By contacting the two pads, the power pulse may be conducted through the antifuse structure, i.e., the insulating layer, after the measurement, without other parts of the circuit device being impaired thereby; after the antifuse structure is transferred into its conductive state, the two pad areas are able to implement a shared pad for the subsequent contacting of the gate.

A connection device which is reversibly transferable between its high-resistance state and its low-resistance state may be achieved, for example, by using semiconductor switch components, e.g., MOSFETs, which are activated differently during the initial measurements or tests than in the following permanent contacting of the gate. The different activation may be achieved by a suitable signal pad, to which a signal is applied for the test and which is subsequently set to a defined potential, for example, in order to allow the conductive connection. Furthermore, subsequent changes of the activation of the semiconductor switch are possible, e.g., by a laser cut or an antifuse connection in an activation line of the signal pad or a control path of the connection device, so that an irreversible transfer into its conductive state may also be performed if a semiconductor switch device is used.

The semiconductor switch component may be integrated in particular. In particular, it may in turn also form a discrete component, i.e., a semiconductor switch component, for example, into which the connection device and optionally a clamping structure are already integrated, so that it may be contacted as a typical semiconductor component and initially allows the measurement or measurements in the contacted state, and subsequently is finally contacted by transferring the connection device into its conductive state.

Several advantages therefore result according to the present invention. Thus, measurements are possible on the semiconductor component, in particular measurements of the gate leakage current and a gate stress test, without the series device already also being contacted in this case, thus preventing possible corruption of the measurement or possible impairment due to applied voltage. After the measurement, complex bonding by a wire bond, i.e., additional conductive means to be attached, is dispensed with; the final contacting is performed by transferring the already present connection device into its conductive state, which is possible with relatively little effort. The circuit device according to the present invention requires less space for this purpose than conventional actuators to be bonded, the safety in relation to external effects, in particular vibrations and accelerations, being increased and therefore a high automotive suitability also being ensured.

DETAILED DESCRIPTION OF THE INVENTION

Figure 1:
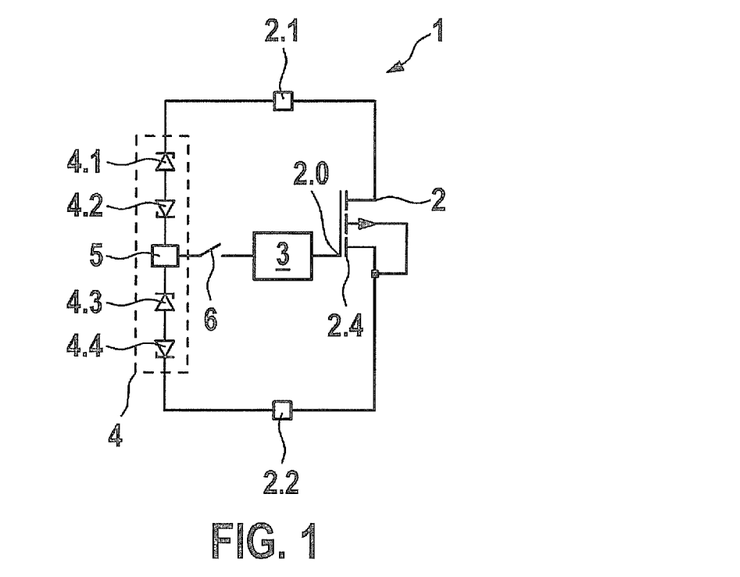
FIG. 1 shows a circuit diagram of a circuit device according to the present invention according to one specific embodiment having clamping of the drain gate voltage and gate source voltage.

A circuit device 1 according to the present invention according to a first specific embodiment is shown in FIG. 1, which has a power MOSFET 2, a gate bond pad 3, and a series device 4, which is connected upstream from the gate of MOSFET 2 and is a protection device 4 here, in particular a clamping structure having Zener diodes 4.1, 4.2, 4.3, 4.4 as shown. Furthermore, according to the present invention, a measuring pad 5 and an antifuse 6 are provided in such a way that antifuse 6 is connected between measuring pad 5 and gate bond pad 3. Measuring pad 5, antifuse 6, and gate bond pad 3 are therefore connected in series upstream from gate 2.0 of MOSFET 2 and are clamped between the drain and the source of MOSFET 2 by clamping structure 4. In addition, drain terminal 2.1 and source terminal 2.2 are shown in FIG. 1, which may also be designed as bond pads, for example; gate oxide 2.4 (not explicitly shown in the switch symbol) is indicated downstream from gate 2.0. Circuit device 1 shown in FIG. 1 may be implemented by discrete components or may also be integrated.

Antifuse 6 is not conductive in the initial state shown, i.e., it blocks or behaves like a high-resistance resistor. Antifuse 6 may be irreversibly transferred into an electrically conductive, i.e., low-resistance, state by a power pulse.

In the initial state shown having high-resistance antifuse 6, a measurement of the gate leakage current may be performed in that a voltage is applied between gate bond pad 3 and one of power terminals 2.1 and 2.2, without a relevant current flowing through protection device 4, since the current is negligible due to antifuse 6 and has no relevant influence on the measurement result; if the gate leakage current is sufficiently low and is below the permissible limiting value, it is fundamentally also not relevant in this case if a relevant amount of the measured current flows via protection device 4 and high-resistance antifuse 6 and therefore the measured value is higher than the gate leakage current.

Figure 2:
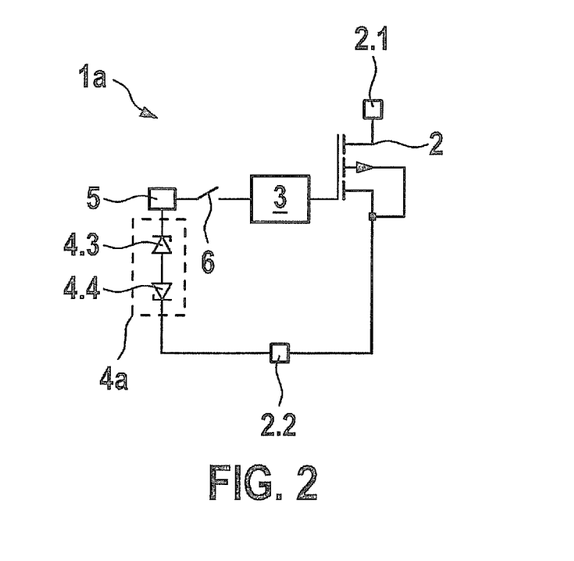
FIG. 2 shows a circuit diagram of a circuit device according to another specific embodiment having only one clamping.

FIG. 2 shows a specific embodiment of a circuit device 1a which is altered in relation to FIG. 1, in which no drain clamp is provided and therefore protection device 4a only has two Zener diodes 4.3 and 4.4 for the source clamping, with otherwise identical functionality as in FIG. 1.

Circuit devices 1 and 1a shown in FIG. 1 and FIG. 2 may be parts of a larger integrated circuit, or may also be implemented as a discrete semiconductor component. Therefore, e.g., FIG. 1 may be designed as a discrete semiconductor component 1, in which Zener diodes 4.1 through 4.4 and antifuse 6, which form protection device 4, are integrated and bond pads 3, 2.1, 2.2 are implemented, the measuring pad also being implemented according to the present invention.

Figure 3A:
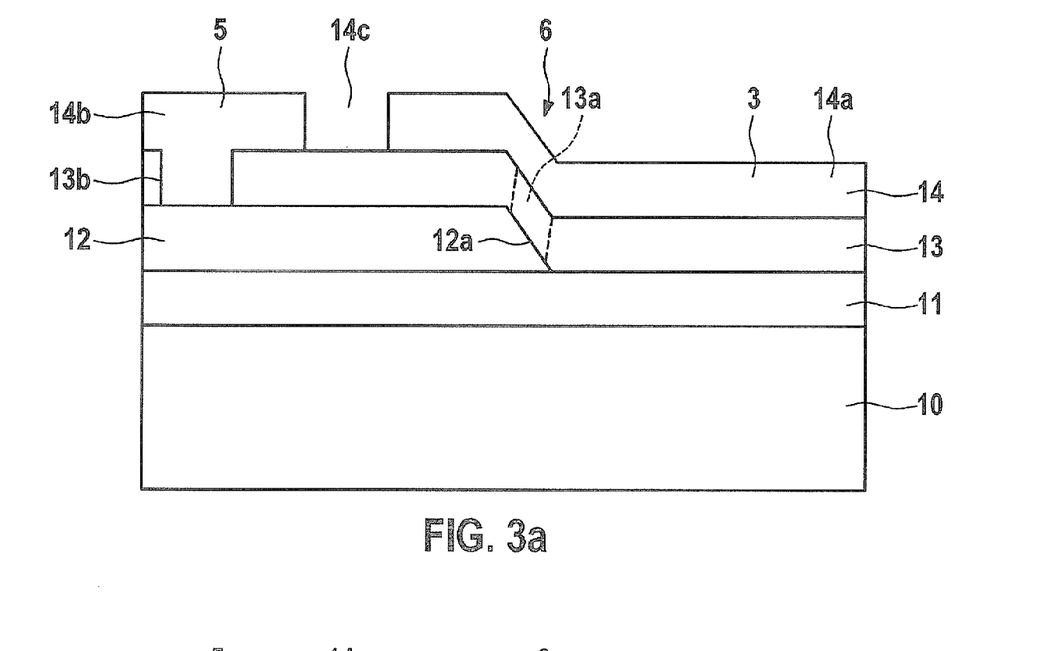
FIG. 3a shows an illustration of the layer structure of a semiconductor component according to the present invention before the irreversible contacting.
Figure 3B:
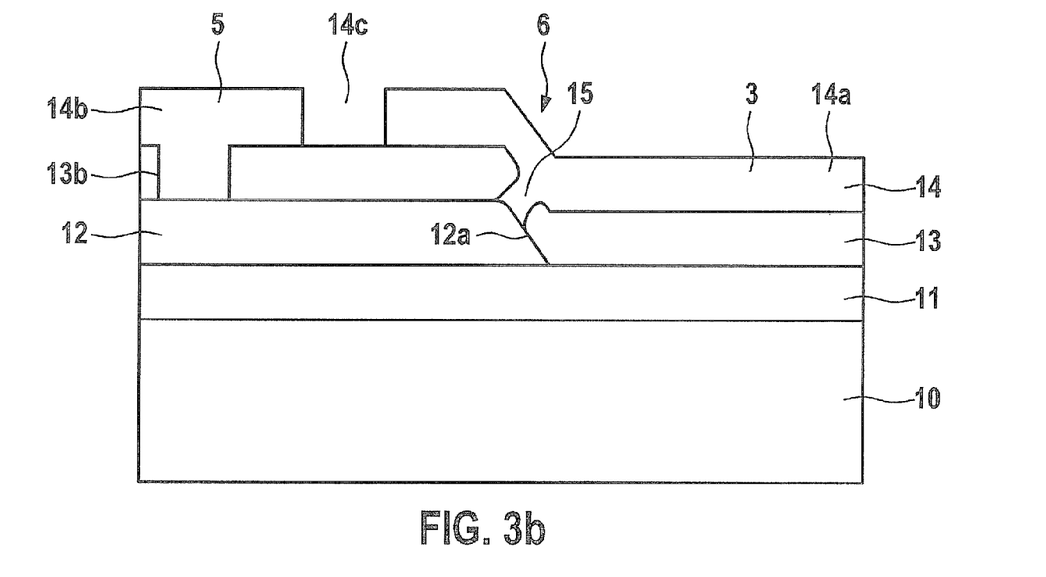
FIG. 3b shows the illustration from FIG. 3a after the irreversible contacting.

FIGS. 3a, 3b show the integrated implementation of antifuse 6, without illustration to scale of the layer thicknesses into the layer structure. First, a lower insulation layer 11 is implemented on a silicon substrate 10, in particular as a field oxide layer, i.e., in a way known per se by oxidation as $SiO_2$. A conductive polysilicon layer 12 is deposited on field oxide layer 11 and laterally structured. The polysilicon may be highly doped in particular, to prevent the formation of a Schottky contact. An upper insulation layer 13 is deposited on polysilicon layer 12, in particular as an intermediate oxide layer, and structured in such a way that it partially covers polysilicon layer 12, it in particular forming a relatively thin burning section area 13a-indicated here by dashed lines— which covers an inclining flank 12a of polysilicon layer 12. A recess 13b is formed above polysilicon layer 12 in upper insulation layer 13. A metal layer 14, e.g., made of aluminum, is deposited on upper insulation layer 13 and laterally structured in such a way that a first contact area 14a is deposited on upper insulation layer 13 and covers burning section area 13a. A second contact area 14b is separated from first contact area 14a via a recess 14c and is applied to upper insulation layer 13 in such a way that it fills up recess 13b and therefore contacts polysilicon layer 12. In this case, first contact area 14a may be used directly as gate bond pad 3 or as a part of gate bond pad 3, and correspondingly second contact area 5 may be used as measuring pad 5 or part of measuring pad 5, or also vice versa.

If, starting from the initial state of FIG. 3a, a power pulse, e.g., 30-40 V at approximately 20 mA, is applied between contact areas 14a and 14b, i.e., between gate bond pad 3 and measuring pad 5, in the event of sufficient voltage, a breakdown may be achieved through upper insulation layer 13 in its burning section area 13a, so that according to FIG. 3b, upper insulation layer 13 is destroyed here and a through contact 15 is formed between contact area 14a and polysilicon layer 12;

thus, the metal of first contact area 14a flows into entirely or partially destroyed burning section area 13a of upper insulation layer 13 and contacts conductive polysilicon layer 12, so that subsequently, contact areas 14a and 14b are contacted with one another. Antifuse 6 is thus irreversibly in its conductive, low-resistance state according to FIG. 3b.

Alternatively to the design according to FIGS. 3a, 3b, the implementation of a burning section in a semiconducting material, e.g., a pn-transition, is also possible.

Figure 4A:
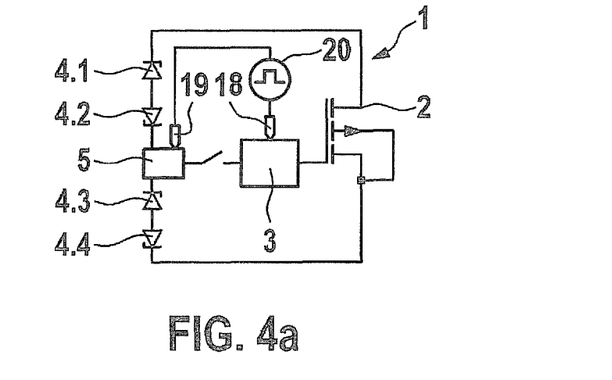
FIGS. 4a, 4b and 4c show the step of connecting or contacting by applying a power pulse according to various specific embodiments.
Figure 4B:
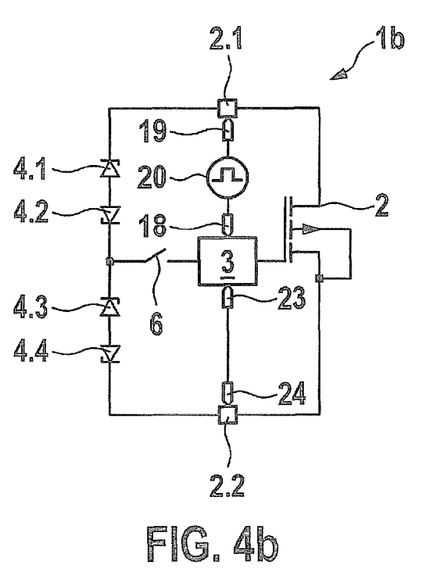
Figure 4C:
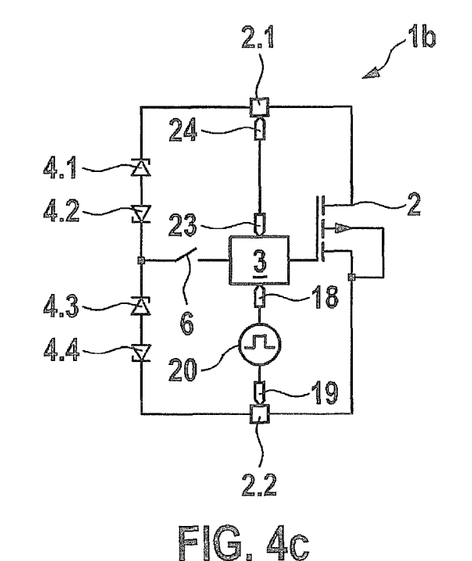

FIGS. 4a through 4c show different specific embodiments of a circuit device according to the present invention or a semiconductor component according to the present invention and possible procedures of the burning of antifuse 6, in order to transfer it from its high-resistance or insulating initial state into its electrically conductive or low-resistance initial state. FIG. 4a shows circuit device 1 corresponding to FIG. 1. In this case, contact electrodes 18, 19 are placed on measuring pad 5 and gate bond pad 3, in order to create an electrical contact, and subsequently a power voltage pulse of, e.g., 30-40 V and, e.g., 20 mA is applied here for 2 ms via a signal source 20 or voltage source, which is therefore applied to antifuse 6 and is sufficient to generate the voltage breakdown described in FIGS. 3a, 3b. Protection device 4 and MOSFET 2 are not loaded in this case; advantageously, upper insulation layer 13 is thinner in FIG. 3 in its thin burning section area 13a than gate oxide 2.4 of MOSFET 2, it also optionally being possible by dimensioning Zener diodes 4.1 through 4.4 for a power voltage pulse to be applied in sufficiently attenuated form between the source and the gate and the drain and the gate of MOSFET 2.

In circuit device 1b of FIG. 4b, signal source 20 is placed via electrodes 18, 19 between drain terminal 2.1 and gate bond pad 3; furthermore, contacting electrodes 23, 24 are applied to short-circuit source terminal 2.2 with gate bond pad 3, in order not to load the source-gate transition and therefore the gate oxide of MOSFET 2. In the signal application according to FIG. 4c, which is an alternative thereto, signal source 20 is placed via electrodes 18, 19 between gate bond pad 3 and source terminal 2.2 and the drain and the gate are therefore short-circuited. In the specific embodiment of circuit device 1b, measuring pad 5 may therefore be dispensed with. The voltage-power pulse output by signal source 20 flows in FIG. 4b through the upper part of clamping structure 4 having Zener diodes 4.1 and 4.2 and through antifuse 6; in FIG. 4c correspondingly via Zener diodes 4.3 and 4.4 of clamping structure 4 and through antifuse 6. In the specific embodiments of FIGS. 4b, 4c, measuring pad 5 is omitted. In the specific embodiment of FIG. 4c, however, damage to the gate oxide of MOSFET 2 may occur. In this case, instead of the implementation of FIG. 3a, in particular an antifuse 6 having a pn-transition may be used, since the burning procedure for the irreversible transfer into the low-resistance state may already be achieved here by applying 5 V, for example, while in contrast the gate oxide of MOSFET 2 has breakdown voltages of 50 V, for example.

Figure 5:
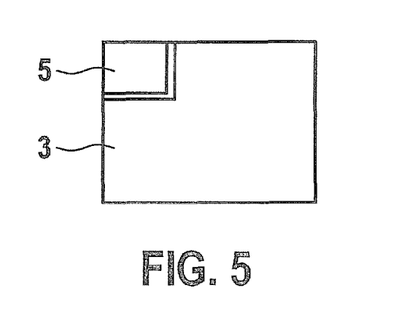
FIG. 5 shows the design of a measuring pad and gate bond pad according to one specific embodiment.

In the specific embodiment of FIGS. 1, 2, and 4a, measuring pad 5 may be integrated into gate bond pad 3, as shown in FIG. 5. Therefore, by integrating antifuse 6 into circuit devices 1, 1a, and 1b and optionally by implementing this pad in circuit devices 1 and 1a, the area required for the integrated circuit is not increased. The contacting electrodes are therefore used in the measurement of the gate oxide leakage current on gate bond pad 3 and measuring pad 5; after the transfer of antifuse 6 into the low-resistance state, gate bond pad 3 and measuring pad 5 are contacted, so that subsequently the entire surface of gate bond pad 3 and measuring pad 5 may be used for applying a bond, i.e., a normally dimensioned bond pad may subsequently be formed from surfaces 3 and 5.

According to another implementation according to the present invention, the activatable gate activation or the subsequent connection of the gate to the series device may also be implemented in the form of a circuit. In particular, reversible activatibility may also be made possible in this way.

Figure 6:
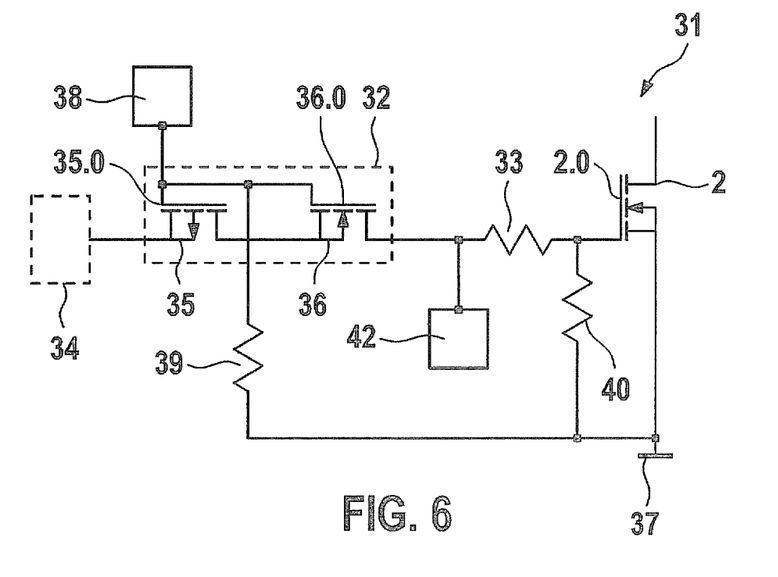
FIG. 6 shows a circuit diagram of a circuit device according to another specific embodiment having reversibly activatable gate activation.

FIG. 6 shows such a specific embodiment of a circuit device 31, which again may be integrated or may be constructed from individual discrete components. MOSFET 2 is designed here as an n-channel MOSFET of the enhancement type, i.e., as self-blocking, other MOSFETs or transistors having gate activation, e.g., also an IGBT, possibly being provided. An actuator 32 is connected to gate 2.0 via a series resistor 33 via which actuator a series device 34 (not described in greater detail here) may be switched in. Series device 34 may include a clamping structure corresponding to clamping structure 4 from FIGS. 1, 2 and/or an activation circuit. Actuator 32 is formed, for example, by two MOSFETs connected in series, e.g., a p-channel MOSFET 35 and an n-channel MOSFET 36. Their gates 35.0, 36.0 are jointly contacted and are activated via a signal pad 38. Furthermore, gates 35.0 and 36.0 and signal pad 38 are connected to ground 37, for example, via a pull-down resistor 39, in order to ensure a defined potential if no signal is applied to signal pad 38. Gate 2.0 of MOSFET 2 is correspondingly connected to ground via a resistor 40. Furthermore, a gate stress pad 42 is connected between actuator 32 and series resistor 33. In contrast to antifuse 6 from FIGS. 1 through 4, actuator 32 is reversibly activatable and deactivatable by appropriately contacting and activating signal pad 38.

Depending on the design of MOSFETs 35, 36, actuator 32 may therefore be conductive in the normal state, in which no signal is applied to signal pad 38, so that gate 2.0 of MOSFET 2 is connected to series device 34; to carry out a gate stress test and/or a gate oxide leakage current measurement, a corresponding signal is applied to signal pad 38 (e.g., via an electrode), so that actuator 32 blocks. During the gate oxide leakage current measurement, a high signal or high voltage level is therefore applied to signal pad 38, so that actuator 32 blocks, and a gate stress measurement is carried out using a high voltage, e.g., 50 V, by application to gate stress pad 42. Actuator 32 therefore forms a transfer gate, in order to implement a conductive connection between gate 2.0 of power MOSFET 2 and series device 34.

Circuit device 31 of FIG. 6 may also be used for the gate leakage current measurement if the ground connection of gate 2.0 via resistor 40 is omitted and pad 42 is applied directly to gate 2.0—without resistor 33.

Figure 7:
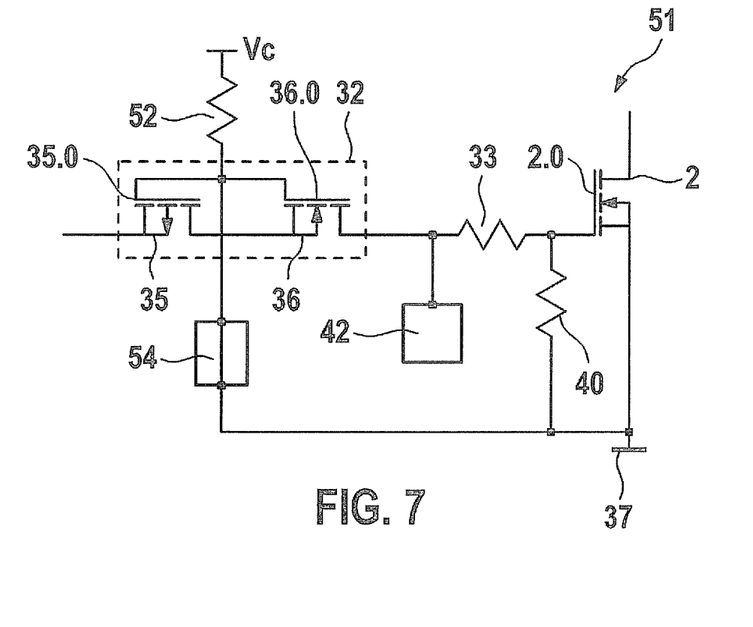
FIG. 7 shows a circuit diagram of another specific embodiment having reversibly activatable gate activation.

FIG. 7 shows a specific embodiment, which is altered somewhat from FIG. 6, in which a series device may again be switched in to power MOSFET 2, having its gate 2.0 correspondingly as in FIG. 6 via resistor 40 at ground or via resistor 33 and actuator 32, and gate stress pad 42 is connected via series resistor 33 to gate 2.0. In FIG. 7, however, gates 35.0 and 36.0 of MOSFETs 35 and 36 are connected via a pull-up resistor 52 to a supply voltage Vc or another positive potential and via an antifuse 54 to ground 37. Antifuse 54 is therefore initially high-resistance or blocking in the initial state, so that actuator 32 blocks and the gate oxide leakage current measurement and optionally other measurements may be carried out via gate pad 42. Subsequently, antifuse 54 is burned and transferred into its conductive state, e.g., by a power pulse on supply voltage terminal Vc, so that gates 35.0 and 36.0 are subsequently connected to ground and therefore actuator 32 is permanently conductive and an optionally connected series device is connected to gate 2.0 of power MOSFET 2. In this case, antifuse 54 may again be implemented according to FIG. 3 or also in the form of a small pn-transition.

In this case, the load is connected in each of FIGS. 6 and 7 to the drain terminal of power MOSFET 2.

Figure 8:
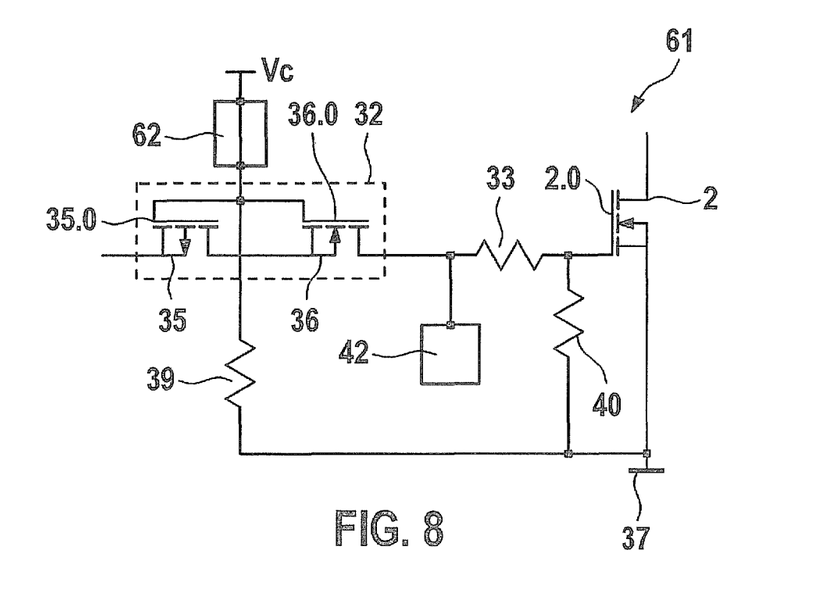
FIG. 8 shows a circuit diagram of another specific embodiment having irreversibly activatable gate activation.

FIG. 8 shows another specific embodiment of a circuit device 61, in which in contrast to FIG. 6, with otherwise corresponding construction, instead of signal pad 38, a laser fuse 62 or a laser safety is provided, via which gates 35.0 and 36.0 are connected to supply voltage Vc or a positive potential. Actuator 32 therefore initially blocks in the case of intact laser fuse 62, so that the measurements may be carried out via gate stress pad 42, and subsequently laser fuse 62 is irreversibly interrupted or destroyed, e.g., by a laser beam. Gates 35.0 and 36.0 of actuator 32 are therefore subsequently connected via pulldown resistor 39 to ground 37, so that actuator 32 permanently conducts.

Figure 9:
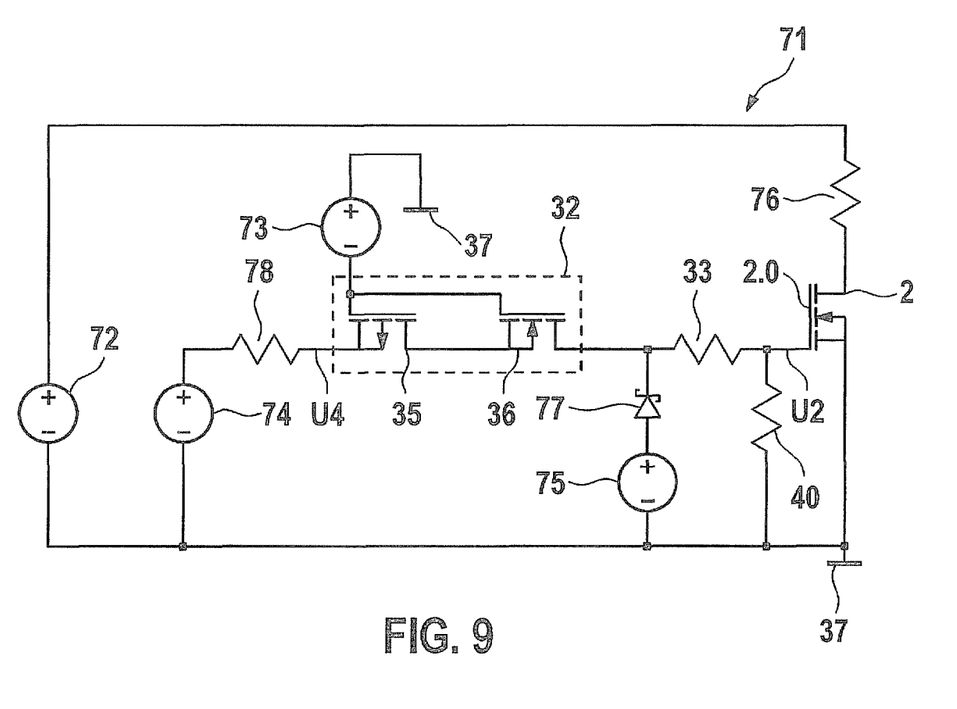
FIG. 9 shows a circuit diagram of another specific embodiment.

FIG. 9 shows an implementation in a circuit device 71, having an indicated voltage source 72 of, e.g., 12 V in a vehicle. Furthermore, signal sources 73, 74, 75 are provided, which are designed in a known way, for example, by integrated circuits or other connected components having different purposes and tasks, the load being shown here as resistor 76. In addition, a diode, e.g., a Zener diode 77, is connected to voltage source 75. The series device is implemented here by signal source 74 having downstream resistor 78 (or its output resistor 78). Gate potential U2 and activation potential U4, which is applied to the input of actuator 32, are shown here.

Figure 10:
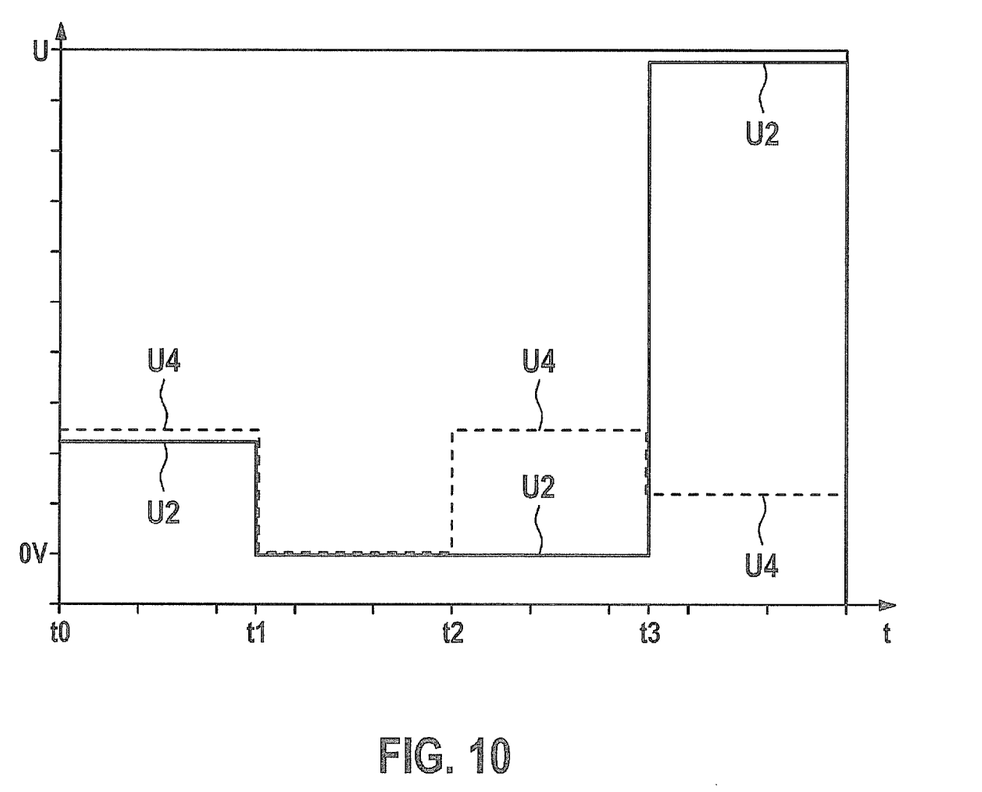
FIG. 10 shows the signal curves of various potentials of the specific embodiment of FIG. 9 as a function of time.

FIG. 10 shows a signal progression of potential U2 (solid line) and U4 (dashed line) of circuit device 71 from FIG. 9 in an exemplary implementation, voltage U being plotted having zero line 0 V against time t. At point in time to, i.e., at 0 ms, up to a first point in time t1, at, e.g., 100 ms (milliseconds), the progression of gate potential U2 at gate 2.0 of power MOSFET 2 follows activation potential U4. In this case, for example, U4=5 V and U2=4.8 V, i.e., with low voltage drop at actuator 32 and resistor 33.

For example, at t1=100 ms, initial potential U4 drops to 0 V, so that correspondingly U2 drops to 0 V until at t2, e.g., t2=200 ms, signal source 73 is activated and therefore actuator 32 blocks. According to the example shown, activation potential U4 may increase simultaneously or also subsequently, without U2 being affected thereby: U2 remains at 0 V.

At point in time t3, e.g., t3=300 ms, a gate stress test is carried out, in which a voltage of, e.g., 20 V is output by voltage source 75; in the implementation in FIGS. 6, 7, 8, the corresponding voltage of, e.g., 20 V is accordingly applied via an electrode to gate stress pad 42. In this way, gate potential U2 subsequently increases to a correspondingly high value, depending on the dimensioning of resistors 33 and 40, according to the voltage divider circuit implemented thereby. In this case, for example, series resistor 33 may be designed having 1 kOhm, and pulldown resistor 40 may be designed having 100 kOhm, a corresponding activation voltage dropping at diode 77, so that U2 assumes the value 19.8 V, for example. The voltage of 20 V output by voltage source 75 retroacts somewhat via blocking actuator 32 in this case, so that U4 may increase to approximately 2 V, for example.

What is claimed is:

1. An electrical circuit device, comprising:
  a semiconductor component having two power terminals and a control terminal for applying a control voltage, wherein the control terminal is electrically insulated from the two power terminals;
  a control terminal contact surface for contacting the control terminal for measuring an electrical behavior of the semiconductor component; and
  a connection device via which the control terminal is selectively electrically connected to a series device, wherein the connection device is switched from a nonconductive state, in which the control terminal is not electrically connected to the series device, into a conductive state, in which the control terminal is electrically connected to the series device;
  wherein the connection device includes an actuator which is configured to be selectively switched between a blocking state for measuring the semiconductor component and a conductive state for connecting the control terminal to the series device,
  wherein the semiconductor component is one of a MOSFET or an IGBT, and wherein the control terminal is a gate which is separated from the two power terminals by a gate insulation layer,
  wherein the connection device is irreversibly switched from the nonconductive state into the conductive state,
  wherein the connection device includes an antifuse which is transferred into the conductive state by applying a power pulse, with at least partial destruction of an internal structure at one of an insulation layer or a semiconductor transition, and
  wherein the circuit device is an integrated circuit, wherein the control terminal is implemented in a form of at least one metal layer, wherein the antifuse is at least a part of the insulation layer which separates and insulates the at least one metal layer from another conductive later, and wherein the insulation later includes a burning section area which is (i) configured to be destroyed by applying the power pulse and (ii) filled using metal of the at least one metal later.

2. The circuit device as recited in claim 1, further comprising:
  a signal contact surface for activating the actuator, wherein the signal contact surface is selectively contacted for inputting a switching signal, and wherein the actuator is in a conductive state in the non-contacted state of the signal contact surface.

3. The circuit device as recited in claim 1, wherein:
  a control input of the actuator is (i) connected to a first potential via a second connection device which is reversibly switched from a nonconductive state into a conductive state, and (ii) connected to a second potential via a resistance device;
  in the nonconductive state of the second connection device, the control input to which the second potential is applied keeps the actuator in the blocking state; and
  in the conductive state of the second connection device, the control input of the actuator is connected to the first potential for setting the conductive state of the actuator.

4. The circuit device as recited in claim 1, wherein:
  a control input of the actuator is (i) connected to a first potential via a second connection device which is reversibly switched from a conductive state into a nonconductive state, and (ii) connected to a second potential via a resistance device;
  in the conductive state of the second connection device, the control input to which the first potential is applied keeps the actuator in the blocking state; and
  in the conductive state of the second connection device, the control input of the actuator is connected to the second potential for setting the conductive state of the actuator.

5. The circuit device as recited in claim 1, wherein the control terminal contact surface is provided for at least one of (i) measuring a gate leakage current and (ii) carrying out a gate stress test to ascertain a voltage breakdown of the gate insulation layer.

6. The circuit device as recited in claim 1, wherein the series device is at least one of (i) a clamping structure for delimiting the control voltage in relation to the power terminals and (ii) an activation circuit for activating the control terminal of the semiconductor component.

7. The circuit device as recited in claim 1, wherein the burning section of the insulation layer is thinner than the gate insulation layer of the semiconductor component.

8. The circuit device as recited in claim 1, further comprising:
   a measuring contact surface which is (i) separate from the control terminal contact surface and (ii) selectively contacted to apply the power pulse between the measuring contact surface and the control terminal contact surface.

9. The circuit device as recited in claim 1, further comprising:
   a measuring contact surface which is selectively contacted to apply the power pulse between the measuring contact surface and the control terminal contact surface, wherein the measuring contact surface is integrated into the control terminal contact surface, and both the measuring contact surface and the control terminal contact surface are jointly contacted after the switching of the connection device into the conductive state.

10. A method for testing a semiconductor component, comprising:
   contacting at least one control terminal contact surface using an electrode;
   at least one of (i) measuring a control terminal leakage current and (ii) carrying out a control terminal stress test by applying a breakdown voltage via the contacted control terminal contact surface and one of another contact surface or a power terminal of the semiconductor component; and
   switching a connection device from a nonconductive initial state into a conductive state in which a control terminal of the semiconductor component is connected to a series device;
   wherein the semiconductor component is one of a MOSFET or an IGBT, and wherein the control terminal is a gate which is separated from the power terminal by a gate insulation layer,
   wherein the connection device is irreversibly switched from the nonconductive state into the conductive state,
   wherein the connection device includes an antifuse which is transferred into the conductive state by applying a power pulse, with at least partial destruction of an internal structure at one of an insulation layer or a semiconductor transition, and
   wherein the control terminal is implemented in a form of at least one metal layer, wherein the antifuse is at least a part of the insulation layer which separates and insulates the at least one metal layer from another conductive layer, and wherein the insulation layer includes a burning section area which is (i) configured to be destroyed by applying the power pulse and (ii) filled using metal of the at least one metal layer.

\* \* \* \* \*